United States Patent
Hopper et al.

(10) Patent No.: US 8,004,061 B1
(45) Date of Patent: *Aug. 23, 2011

(54) CONDUCTIVE TRACE WITH REDUCED RF IMPEDANCE RESULTING FROM THE SKIN EFFECT

(75) Inventors: Peter J. Hopper, San Jose, CA (US);
Peter Johnson, Sunnyvale, CA (US);
Kyuwoon Hwang, Palo Alto, CA (US);
Michael Mian, Livemore, CA (US);
Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 26 days.

This patent is subject to a terminal disclaimer.

(21) Appl. No.: 10/897,901

(22) Filed: Jul. 23, 2004

Related U.S. Application Data

(63) Continuation of application No. 10/219,235, filed on Aug. 15, 2002, now Pat. No. 6,853,079.

(51) Int. Cl.
*H01L 29/00* (2006.01)

(52) U.S. Cl. ........ 257/531; 257/781; 257/528; 257/774; 257/758; 257/E23.158

(58) Field of Classification Search .................. 257/531, 257/781, 528, 774, 758, E23.152
See application file for complete search history.

(56) References Cited

U.S. PATENT DOCUMENTS

| | | | |
|---|---|---|---|
| 3,573,540 A | 4/1971 | Osepchuk | 315/3.5 |
| 4,165,558 A | 8/1979 | Armitage, Jr. et al. | 29/572 |
| 4,541,893 A | 9/1985 | Knight | 156/643 |
| 5,434,094 A | 7/1995 | Kobiki et al. | 437/40 |
| 5,472,901 A | 12/1995 | Kapoor | 437/60 |
| 5,741,741 A | 4/1998 | Tseng | 438/637 |
| 5,952,704 A | 9/1999 | Yu et al. | 257/531 |
| 5,976,972 A | 11/1999 | Inohara et al. | 438/640 |
| 5,986,346 A | 11/1999 | Katoh | 257/773 |
| 5,998,299 A | 12/1999 | Krishnan | 438/694 |
| 6,051,470 A | 4/2000 | An et al. | 438/283 |
| 6,104,055 A * | 8/2000 | Watanabe | 257/309 |
| 6,107,177 A | 8/2000 | Lu et al. | 438/597 |
| 6,150,725 A | 11/2000 | Misawa et al. | 257/781 |
| 6,191,023 B1 | 2/2001 | Chen | 438/612 |
| 6,197,682 B1 | 3/2001 | Drynan et al. | 438/639 |
| 6,218,302 B1 | 4/2001 | Braeckelmann et al. | 438/687 |
| 6,232,215 B1 | 5/2001 | Yang | 438/622 |
| 6,251,740 B1 * | 6/2001 | Johnson et al. | 438/381 |
| 6,258,720 B1 | 7/2001 | Gris | 438/689 |
| 6,277,727 B1 | 8/2001 | Kuo et al. | 438/618 |
| 6,281,135 B1 | 8/2001 | Han et al. | 438/725 |
| 6,310,386 B1 | 10/2001 | Shenoy | 257/531 |
| 6,326,673 B1 | 12/2001 | Liou | 257/531 |
| 6,362,012 B1 * | 3/2002 | Chi et al. | 438/3 |
| 6,395,637 B1 * | 5/2002 | Park et al. | 438/706 |

(Continued)

OTHER PUBLICATIONS

Hopper et al, U.S. Appl. No. 11/403,123, filed Apr. 12, 2006.

(Continued)

*Primary Examiner* — Junghwa M Im
(74) *Attorney, Agent, or Firm* — Mark C. Pickering

(57) ABSTRACT

The radio frequency (RF) impedance of a metal trace at gigahertz frequencies is reduced by forming the metal trace to have a base region and a number of fins that extend away from the base region. When formed in a spiral configuration having a number of loops, the metal trace forms an inductor with an increased quality factor (Q).

20 Claims, 8 Drawing Sheets

U.S. PATENT DOCUMENTS

| | | | |
|---|---|---|---|
| 6,413,832 B1 | 7/2002 | Wu et al. ................. | 438/396 |
| 6,417,087 B1 | 7/2002 | Chittipeddi et al. .......... | 438/612 |
| 6,437,385 B1 | 8/2002 | Bertin et al. ................. | 257/301 |
| 6,444,517 B1 | 9/2002 | Hsu et al. ................. | 438/238 |
| 6,452,247 B1 * | 9/2002 | Gardner ................. | 257/528 |
| 6,495,469 B1 | 12/2002 | Yang et al. ................. | 438/725 |
| 6,566,242 B1 | 5/2003 | Adams et al. ................. | 438/622 |
| 6,613,668 B2 | 9/2003 | Meijer et al. ................. | 438/639 |
| 6,664,581 B2 | 12/2003 | Stamper ................. | 257/301 |
| 6,703,710 B1 | 3/2004 | Hopper et al. | |
| 6,740,956 B1 | 5/2004 | Hopper et al. | |
| 6,750,750 B2 * | 6/2004 | Jiong et al. ................. | 336/200 |
| 6,853,079 B1 | 2/2005 | Hopper et al. | |
| 6,864,581 B1 | 3/2005 | Hopper et al. | |
| 7,098,044 B1 | 8/2006 | Hopper et al. | |
| 7,223,680 B1 | 5/2007 | Hopper et al. | |
| 7,271,465 B2 | 9/2007 | Jessie et al. | |
| 7,309,639 B1 | 12/2007 | Hopper et al. | |
| 2002/0024150 A1 | 2/2002 | Farrar ................. | 257/786 |
| 2002/0105405 A1 | 8/2002 | Lee et al. | |
| 2002/0151165 A1 | 10/2002 | Chung ................. | 438/618 |
| 2003/0170989 A1 | 9/2003 | Bothra | |
| 2004/0140526 A1 | 7/2004 | Jiong et al. | |
| 2007/0026659 A1 | 2/2007 | Chinthakindi et al. | |

OTHER PUBLICATIONS

Hopper et al, U.S. Appl. No. 11/013,490, filed Dec. 15, 2004.
U.S. Appl. No. 11/013,490 to Hopper et al filed Dec. 15, 2004.
U.S. Appl. No. 11/403,123 to Hopper et al filed Apr. 12, 2006.
U.S. Appl. No. 11/013,490, filed Dec. 15, 2004 to Peter J. Hopper et al.

* cited by examiner

US 8,004,061 B1

CONDUCTIVE TRACE WITH REDUCED RF IMPEDANCE RESULTING FROM THE SKIN EFFECT

RELATED APPLICATIONS

The present application is a continuation of application Ser. No. 10/219,235 filed on Aug. 15, 2002 for Peter Hopper et al, now U.S. Pat. No. 6,853,079, issued on Feb. 8, 2005. The present application is also related to application Ser. No. 10/219,791, now U.S. Pat. No. 6,703,710, for "Dual Damascene Metal Trace with Reduced RF Impedance Resulting from the Skin Effect" by Peter J. Hopper et al., application Ser. No. 10/219,896, now U.S. Pat. No. 6,740,956, for "Metal Trace with Reduced RF Impedance Resulting from the Skin Effect" by Peter J. Hopper et al., and application Ser. No. 10/219,212, now U.S. Pat. No. 6,864,581, for "Etched Metal Trace with Reduced RF Impedance Resulting from the Skin Effect" by Peter J. Hopper et al.

BACKGROUND OF THE INVENTION

1. Field of the Invention

The present invention relates to conductive traces and, more particularly, to a conductive trace with reduced RF impedance resulting from the skin effect.

2. Description of the Related Art

Metal traces are common integrated circuit elements that are used in a multi-level interconnect structure to connect together various elements of a circuit. In addition, a metal trace can be used to form an integrated circuit inductor by forming the trace to have a number of coils or loops. Inductors are common circuit elements in radio frequency (RF) applications, such as digital cellular telephones.

FIGS. 1A-1D show views that illustrate a prior art integrated circuit inductor 100. FIG. 1A shows a plan view of inductor 100. FIG. 1B shows a cross-sectional view taken along lines 1B-1B of FIG. 1A. FIG. 1C shows a cross-sectional view taken along lines 1C-1C of FIG. 1A. FIG. 1D shows a cross-sectional view taken along lines 1D-1D of FIG. 1A.

As shown in FIGS. 1A-1D, inductor 100 is formed on top of a four-metal layer interconnect structure that includes a fourth layer of insulation material I4, and a metal trace 110 that is formed on insulation layer I4 from a fourth metal layer M4. In addition, the metal interconnect structure includes a fifth layer of insulation material I5 that is formed on metal trace 110, and a via 112 that is formed through insulation layer I5 to make an electrical connection with metal trace 110.

As further shown in FIGS. 1A-1D, inductor 100 includes a metal trace 114 that is formed on top of the fifth layer of insulation material I5 from a fifth metal layer M5. Metal trace 114, which has a width W and a depth D, has a first end 120 that is formed over via 112 to make an electrical connection with via 112, and a second end 122. Metal trace 114, which makes one and a half loops in the same plane, is typically formed on top of the metal interconnect structure to avoid inducing currents in the substrate.

One important measure of a metal trace is the RF impedance of the trace, which affects the quality factor or Q of an inductor formed from the metal trace. High Q inductors are desirable in a number of RF circuits, such as resonant circuits. The Q of an inductor is a measure of the ratio of magnetic energy stored in the inductor versus the total energy fed into the inductor, and is given by equation (EQ.) 1 as:

$$Q = \omega L/Z, \quad \text{EQ. 1}$$

where ω is related to the frequency f of the signal applied to the inductor (ω=2(pi)(f)), L represents the inductance of the inductor, and Z represents the RF impedance of the inductor. (Impedance is the vector sum of resistance and reactance, and introduces a phase shift.) Thus, as indicated by EQ. 1, the smaller the impedance, the higher the Q of the inductor.

One problem with metal traces is that when gigahertz-frequency signals are placed on the trace, the skin effect causes current to flow primarily at the surface. This effectively increases the RF impedance of the trace which, in turn, lowers the Q of an inductor formed from the trace.

One common approach to reducing the impedance of an integrated circuit inductor is to increase the size of the metal trace. However, in integrated circuit applications, there are practical limitations to the size of the metal trace. As a result, there is a need for a metal trace with reduced RF impedance which, in turn, allows a high Q integrated circuit inductor to be realized from the trace.

BRIEF DESCRIPTION OF THE DRAWINGS

FIG. 1A is a plan view of inductor 100. FIG. 1B is a cross-sectional view taken along lines 1B-1B of FIG. 1A. FIG. 1C is a cross-sectional view taken along lines 1C-1C of FIG. 1A. FIG. 1D is a cross-sectional view taken along lines 1D-1D of FIG. 1A.

FIG. 2A is a plan view of structure 200, while FIG. 2B is a cross-sectional view taken along line 2B-2B of FIG. 2A.

FIG. 3A is a plan view of inductor 300, while FIG. 3B is a cross-sectional view taken along lines 3B-3B of FIG. 3A. FIG. 3C is a cross-sectional view taken along lines 3C-3C of FIG. 3A. FIG. 3D is a cross-sectional view taken along lines 3D-3D of FIG. 3A.

DETAILED DESCRIPTION OF THE INVENTION

Figure 1A:
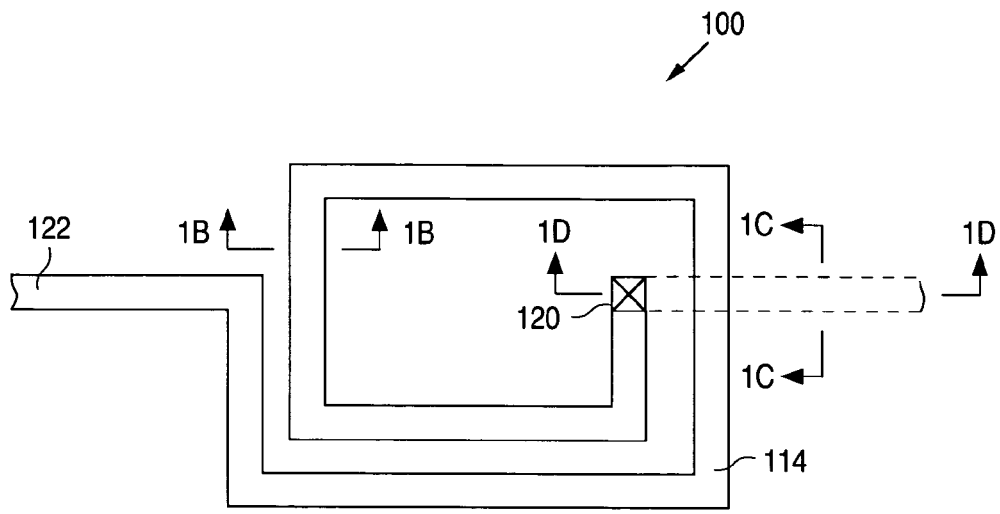
FIGS. 1A-1D are views illustrating a prior art integrated circuit inductor 100.
Figure 1B:
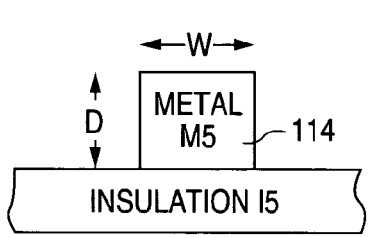
Figure 1C:
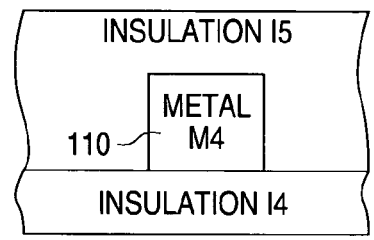
Figure 1D:
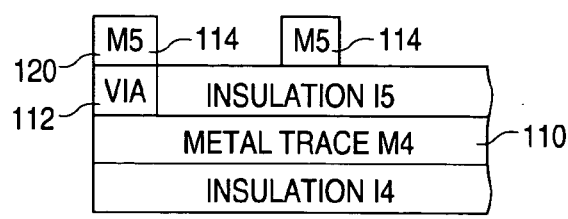
Figure 2A:
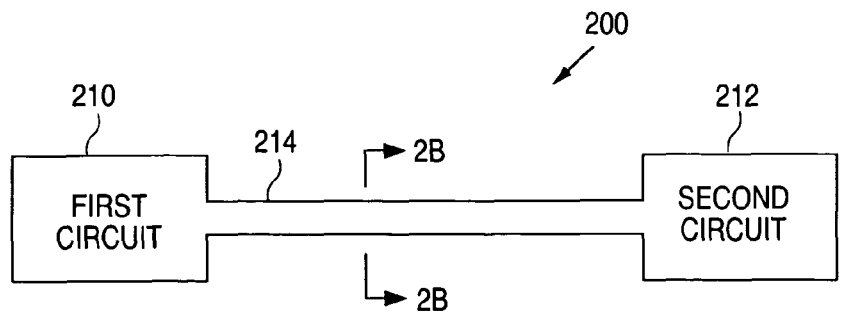
FIGS. 2A-2B are views illustrating an example of an integrated circuit structure 200 in accordance with the present invention.
Figure 2B:
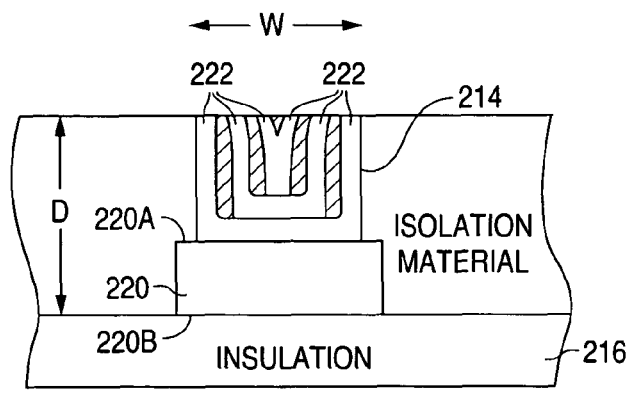

FIGS. 2A-2B show views that illustrate an example of an integrated circuit structure 200 in accordance with the present invention. FIG. 2A shows a plan view of structure 200, while FIG. 2B shows a cross-sectional view taken along line 2B-2B of FIG. 2A. As described in greater detail below, structure 200 utilizes a conductive trace that has been formed to have an increased surface area. The increased surface area, in turn, reduces the impedance of the trace at gigahertz frequency levels.

As shown in FIGS. 2A-2B, structure 200 includes a first circuit 210 that operates on a gigahertz frequency signal, and a second circuit 212 that operates on a gigahertz frequency signal. In addition, structure 200 includes a metal trace 214 that is electrically connected to circuits 210 and 212. Metal trace 214, which is formed on a layer of insulation material 216, passes gigahertz frequency signals between circuits 210 and 212.

As further shown in FIG. 2B, metal trace 214 has a width W (of approximately four microns) and a depth D (of approximately four microns). Metal trace 214 also has a base region 220 with a top side 220A and a bottom side 220B, and a number of spaced-apart fins 222 that extend away from top side 220A. Fins 222, in turn, substantially increase the surface area of metal trace 214 when compared to a conventional metal trace that has the same width W and depth D, such as metal trace 114.

In operation, when a signal in the gigahertz frequency range is placed on metal trace 214 by circuit 210 or circuit 212, current flows primarily at the surface of metal trace 214 due to the skin effect. Thus, in accordance with the present invention, since current flows primarily at the surface and fins 222 substantially increase the surface area of metal trace 214, fins 222 allow more current to flow. As a result, fins 222 effectively reduce the RF impedance of metal trace 214.

Thus, the present invention reduces the RF impedance of a metal trace that interconnects two gigahertz frequency devices. (The metal trace connecting together two gigahertz frequency devices can be formed from any one of the layers of metal used to form the metal interconnect structure, such as the first layer of metal, or a combination of metal layers and vias.)

Figure 3A:
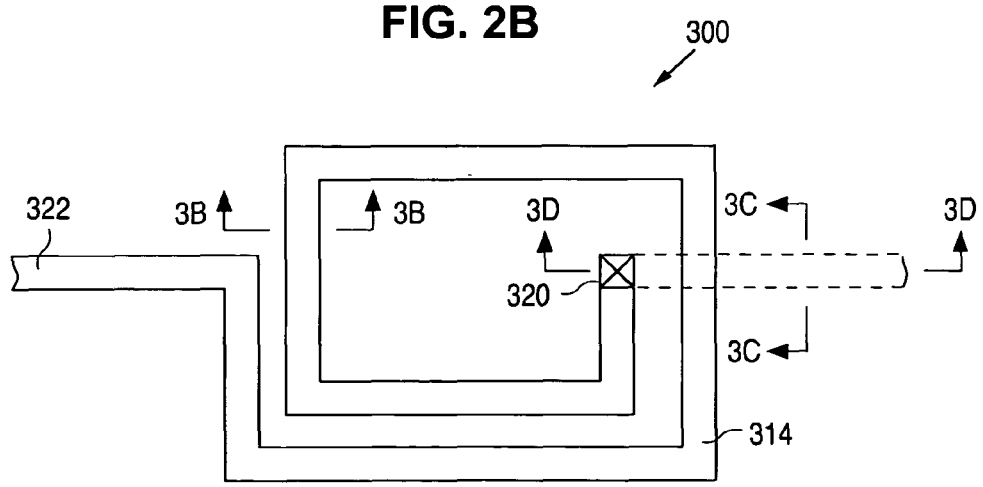
FIGS. 3A-3D are views illustrating an example of an integrated circuit inductor 300 in accordance with the present invention.
Figure 3B:
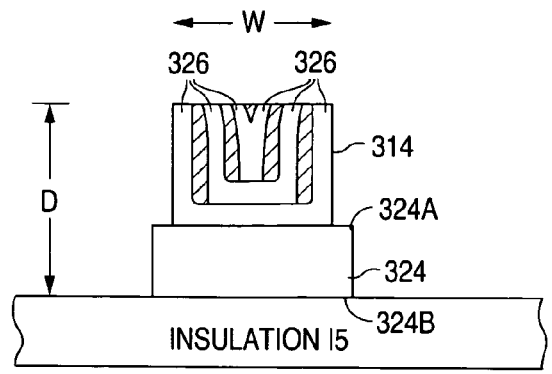
Figure 3C:
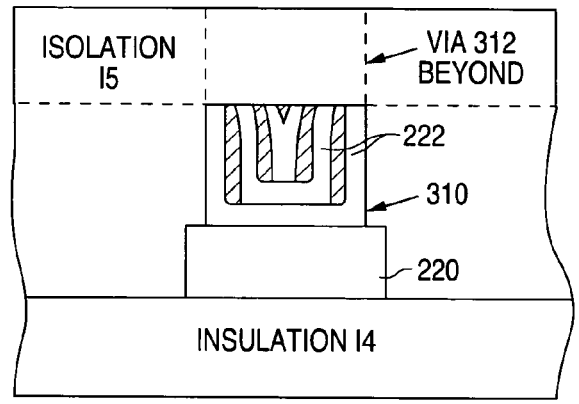
Figure 3D:
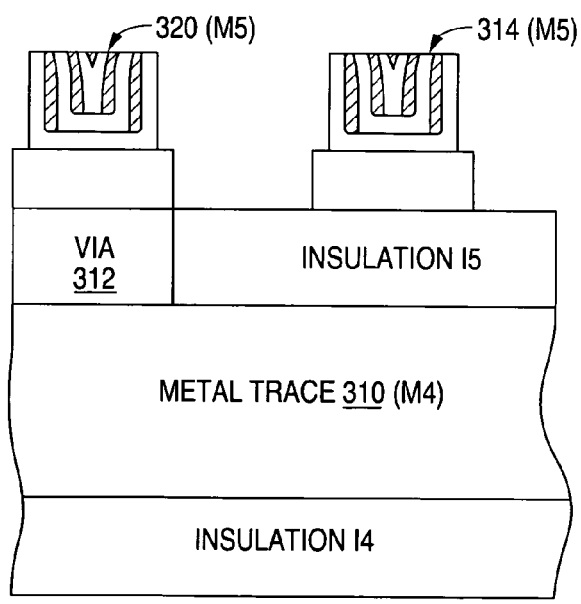

FIGS. 3A-3D show views that illustrate an example of an integrated circuit inductor 300 in accordance with the present invention. FIG. 3A shows a plan view of inductor 300, while FIG. 3B shows a cross-sectional view taken along lines 3B-3B of FIG. 3A. FIG. 3C shows a cross-sectional view taken along lines 3C-3C of FIG. 3A. FIG. 3D shows a cross-sectional view taken along lines 3D-3D of FIG. 3A.

As described in greater detail below, inductor 300 is formed from a metal trace that has been formed to have an increased surface area. The increased surface area, in turn, reduces the RF impedance of the metal trace when gigahertz-frequency signals are placed on the trace. As a result, the metal trace of the present invention can be used to form integrated circuit inductors with an increased Q.

In the example shown in FIGS. 3A-3D, like inductor 100, inductor 300 is formed on top of a four metal layer interconnect structure. The interconnect structure includes a fourth layer of insulation material I4, and a metal trace 310 that is formed on insulation layer I4 from a fourth metal layer M4. In addition, the metal interconnect structure includes a fifth layer of insulation material I5 that is formed on metal trace 310, and a via 312 that is formed through insulation layer I5 to make an electrical connection with metal trace 310.

As further shown in FIGS. 3A-3D, inductor 300 includes a metal trace 314 that is formed on top of the fifth layer of insulation material I5 from a fifth metal layer M5. (Metal trace 314 can be formed from any metal layer, including the first metal layer. The fifth metal layer of the present example is but one possibility. By forming inductor 300 on top of a metal interconnect structure, however, induced substrate currents are minimized).

In addition, metal trace 314 has a first end 320 that is formed over via 312 to make an electrical connection with via 312, and a second end 322. (In this example, second end 322 can be connected to a via connected to a metal-4 trace, or a via connected to a pad or another overlying metal trace.)

Metal trace 314 also has a width W (of approximately four microns) and a depth D (of approximately four microns). Further, metal trace 314 makes one and a half loops in the same plane. (Trace 314 is not limited to one and a half loops, but can be formed with a different number of loops.)

As further shown in FIG. 3B, metal trace 314 has a base region 324 with a top side 324A and a bottom side 324B, and a number of spaced-apart fins 326 that extend away from top side 324A. Fins 326, in turn, substantially increase the surface area of metal trace 314 when compared to a conventional metal trace that has the same width W and depth D, such as metal trace 114.

In operation, when a signal in the gigahertz frequency range is input to inductor 300, current flows primarily at the surface of metal trace 314 due to the skin effect. Thus, in accordance with the present invention, since current flows primarily at the surface and fins 326 substantially increase the surface area of metal trace 314, fins 326 allow more current to flow.

As a result, fins 326 effectively reduce the RF impedance of metal trace 314, thereby increasing the Q of inductor 300. In addition, as illustrated by FIG. 3C, metal trace 310 can be formed as metal trace 214, thereby providing a low RF impedance pathway from inductor 300 (a first gigahertz frequency device) to another gigahertz frequency device.

Figure 4A:
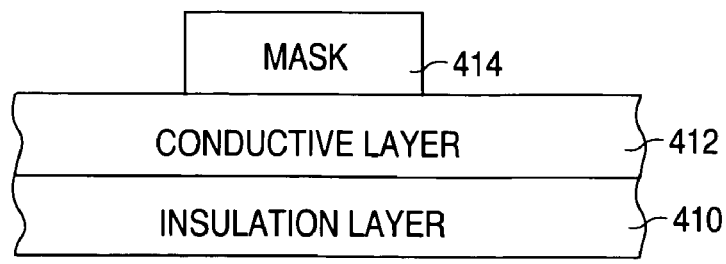
FIGS. 4A-4O are cross-sectional drawings illustrating an example of a method of forming a conductive trace in accordance with the present invention.
Figure 4B:
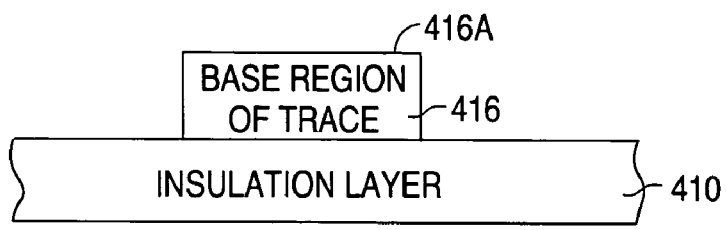
Figure 4C:
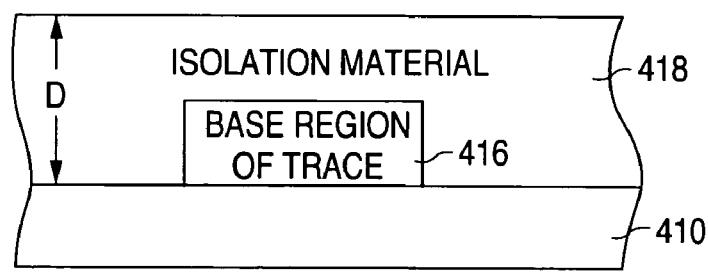
Figure 4D:
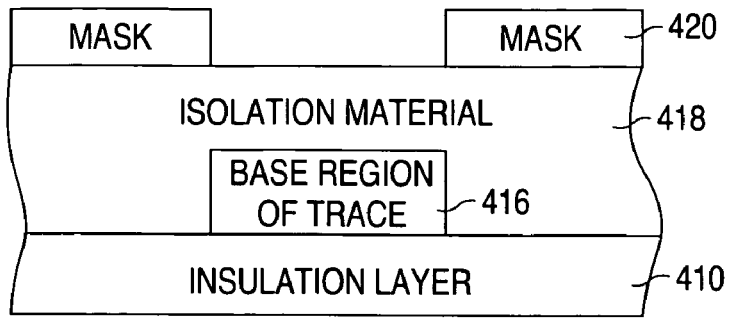
Figure 4E:
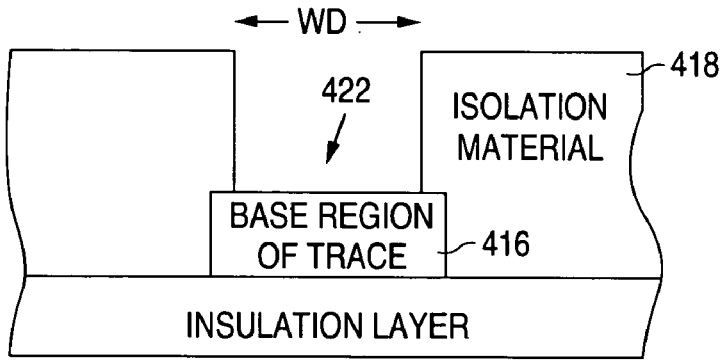
Figure 4F:
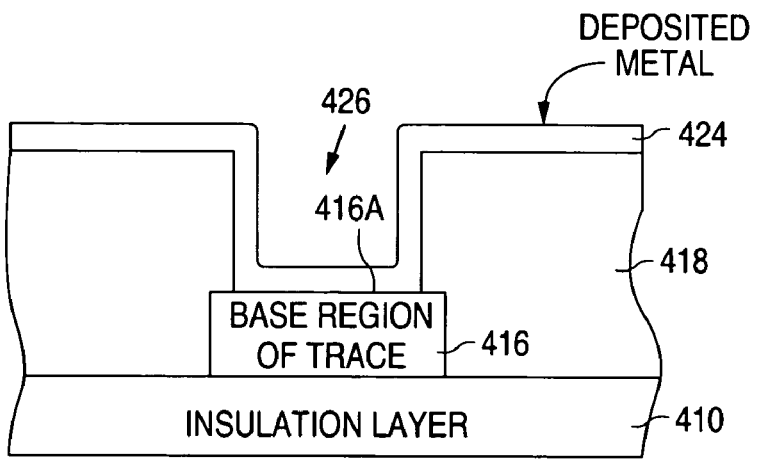
Figure 4G:
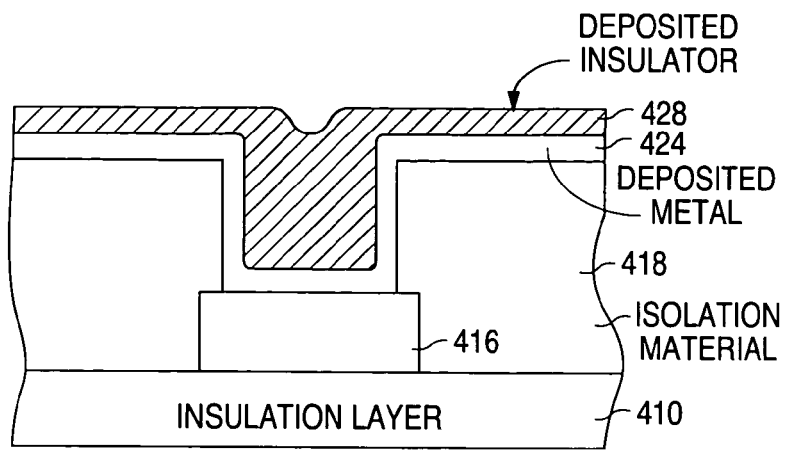
Figure 4H:
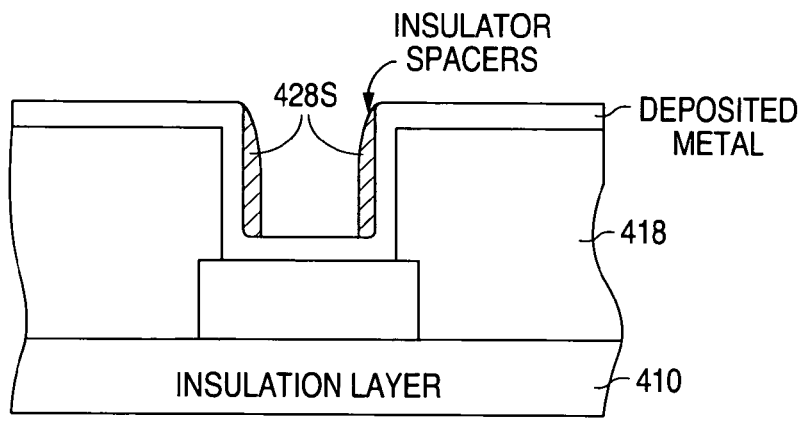
Figure 4I:
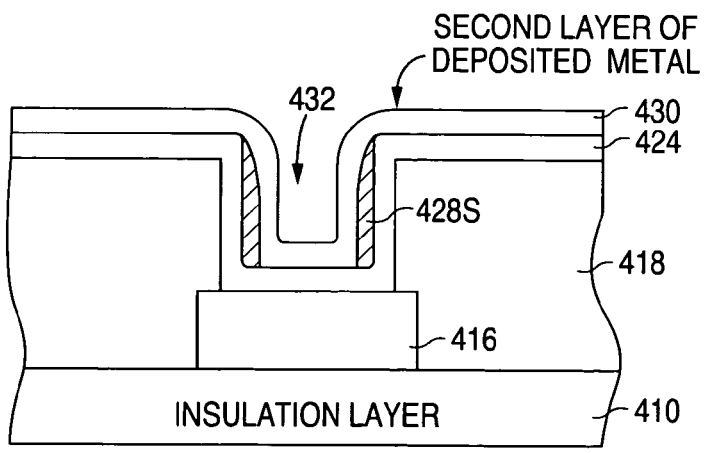
Figure 4J:
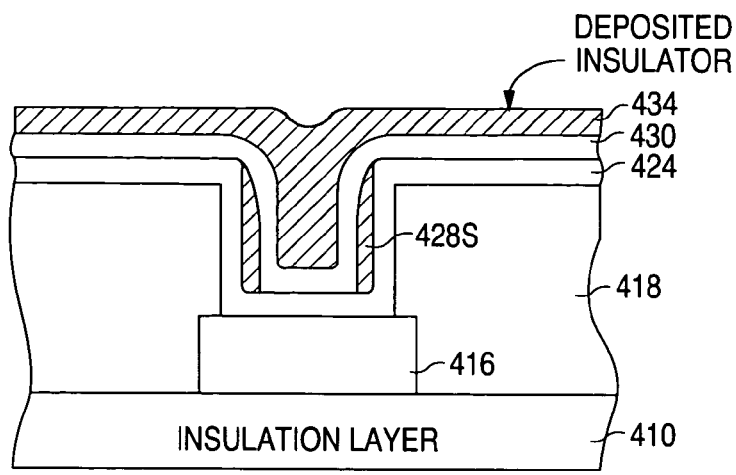
Figure 4K:
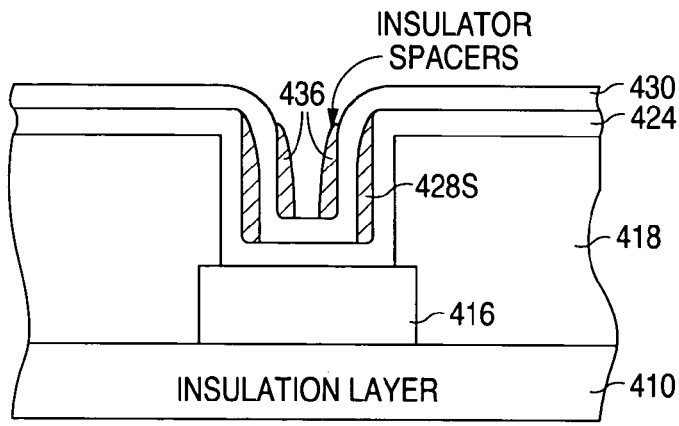
Figure 4L:
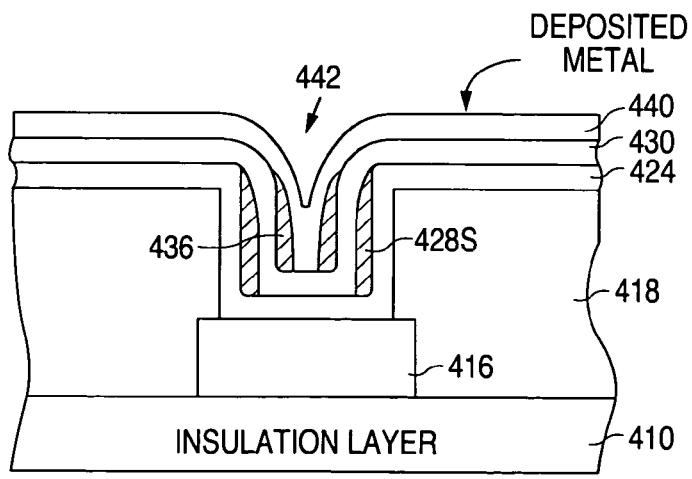
Figure 4M:
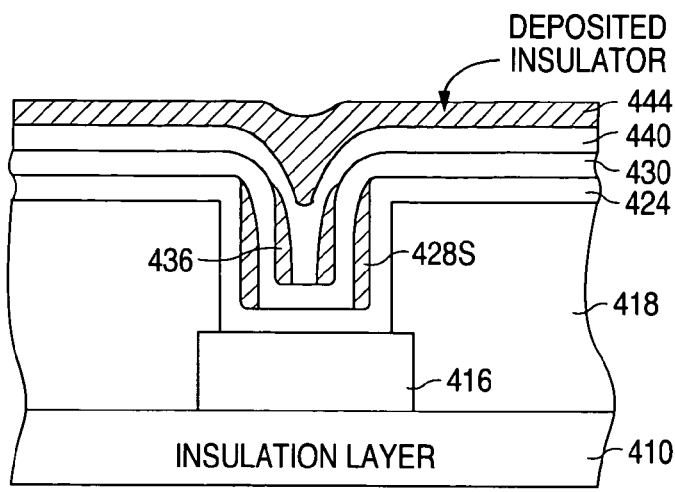
Figure 4N:
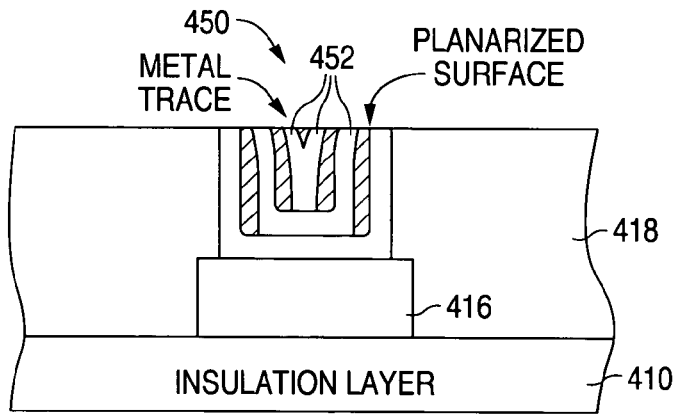
Figure 4O:
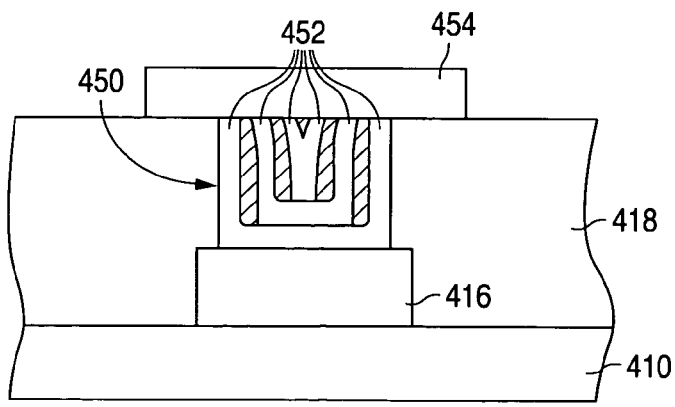

FIGS. 4A-4O show cross-sectional drawings that illustrate an example of a method of forming a conductive trace in accordance with the present invention. As shown in FIG. 4A, the method utilizes a layer of insulation material 410 that has been formed over a semiconductor integrated circuit device. Insulation layer 410, in turn, has a number of contacts or vias that have been formed through insulation layer 410.

In addition, insulation layer 410 can be formed on the surface of the substrate of the device, or on top of a metal trace that is formed from any of the layers of metal that are used to form the metal interconnect structure of the device. For example, when a semiconductor integrated circuit device is fabricated with a five layer metal process, insulation layer 410 can be formed on the metal-4 layer.

As further shown in FIG. 4A, the method of the present invention begins by forming a layer of conductive material 412, such as copper or aluminum, on insulation layer 410. After this, a layer of masking material 414 is formed and patterned on conductive layer 412.

Next, as shown in FIG. 4B, the exposed regions of conductive layer 412 are etched to form a base region 416 of the to-be-formed conductive trace on insulation layer 410. Region 416, which has a top surface 416A, can be formed in a spiral configuration having a number of loops that lie substantially in the same plane, thereby forming an inductor.

In addition, base region 416 can be connected to a contact or a via formed through insulation material 410. (Region 416 can contact more than one contact or via, or no vias if an overlying metal layer and vias are used to make an electrical connection). Once base region 416 has been formed, mask 414 is removed.

After this, as shown in FIG. 4C, base region 416 is covered with a layer of isolation material 418. Isolation layer 418 is formed to a depth D, which is equal to the overall depth of the to-be-formed conductive trace. Following this, as shown in FIG. 4D, a layer of masking material 420 is formed on isolation layer 418. Masking material 420, which can be implemented with a soft mask material (photoresist) or a hard mask material (nitride), is then patterned to expose regions on the surface of isolation layer 418.

Next, as shown on FIG. 4E, isolation layer 418 is anisotropically etched to remove isolation layer 418 from the exposed region of top surface 416A of base region 416. The anisotropic etch forms a trench 422 that has a width WD, which is approximately equal to the cross-sectional width W of traces 214 and 314.

Following this, as shown on FIG. 4F, a first conductive film 424 is deposited on the surface of isolation layer 418 and the exposed region of top surface 416A so that first conductive film 424 makes an electrical connection with base region 416. The deposition of film 424 forms a trench 426 that is smaller than trench 422.

Next, as shown in FIG. 4G, the method continues by forming a first insulating layer 428 on first conductive film 424 to fill up trench 426. Once layer 428 has been formed, as shown in FIG. 4H, layer 428 is anisotropically etched to remove insulating layer 428 from the top surface of conductive film 424 over isolation layer 418. The anisotropic etching process leaves insulating layer 428 on the sidewalls of trench 426, forming insulating sidewall spacers 428S.

Next, as shown on FIG. 4I, a second conductive film 430 is deposited on base region 416, first conductive film 424, and spacers 428S to form a narrower, shallower trench 432. Second conductive film 430 makes an electrical connection with first conductive film 424.

As shown on FIG. 4J, the method continues by depositing a second insulating layer 434 on second conductive film 430 to fill up trench 432. Then, as shown on FIG. 4K, second insulating layer 434 is anisotropically etched to remove layer 434 from the top surface of film 430 over isolation layer 418. The etch forms insulating sidewall spacers 436.

A third conductive film 440 is then deposited over the second conductive film 430 and the insulating sidewall spacers 436, as shown on FIG. 4L. Third conductive film 440 makes an electrical connection with second conductive film 430, and creates a narrow trench 442.

As shown on FIG. 4M, an insulating layer 444 is then deposited on conductive film layer 440. Insulating layer 444 is formed in a depth sufficient to fill trench 442 created by the previous conductive film layer. Then, as shown on FIG. 4N, insulating layer 444, conductive films 424, 430, and 440, and spacers 428S and 436 are planarized using, for example, a chemical mechanical polishing process, until the top surface of isolation layer 418 is exposed. The planarization results in formation of a conductive trace 450 with a plurality of fins 452 extending upward from base region 416, in accordance with the present invention.

Next, as shown on FIG. 4O, the method continues with the formation of insulating material 454 to electrically isolate conductive trace 450 from other components in the semiconductor structure. Following this, the method continues with conventional semiconductor fabrication steps.

In the present invention, the conductive film layers can be formed from the same or different materials. Similarly, the insulating and isolation layers can be formed from the same or different materials. Further, although the present examples have been described in terms of using three metal depositions to form the fins, by varying the dimensions of the trace and the depth of the deposited layers it is possible to create a trace with a greater or lesser number of fins in accordance with the present invention.

It should be understood that the above descriptions are examples of the present invention, and that various additional alternatives of the invention described herein may be employed in practicing the invention. Thus, it is intended that the following claims define the scope of the invention and that structures and methods within the scope of these claims and their equivalents be covered thereby.

What is claimed is:

1. A semiconductor device comprising:
    a layer of insulation material formed over a semiconductor substrate; and
    a conductive trace that contacts the layer of insulation material, the conductive trace having:
        a conductive base region having a length substantially greater than a width;
        a first conductive region having a U-shape with a base section that touches the conductive base region, a left sidewall that touches the base section, and a right sidewall that touches the base section; and
        a second conductive region having a U-shape with a base section that touches the base section of the first conductive region, a left sidewall that touches the base section of the second conductive region, and a right sidewall that touches the base section of the second conductive region, the left sidewall of the first conductive region and the left sidewall of the second conductive region being laterally electrically isolated, the right sidewall of the first conductive region and the right sidewall of the second conductive region being laterally electrically isolated.

2. The semiconductor device of claim 1 wherein only isolation material lies laterally between the right sidewalls of the first and second conductive regions and the left sidewalls of the first and second conductive regions.

3. The semiconductor device of claim 1 wherein the right sidewalls of the first and second conductive regions and the left sidewalls of the first and second conductive regions have top surfaces that lie in a same horizontal plane.

4. The semiconductor device of claim 1 wherein the right sidewalls of the first and second conductive regions and the left sidewalls of the first and second conductive regions are substantially normal to a top surface of the conductive base region.

5. The semiconductor device of claim 1 wherein the right sidewalls of the first and second conductive regions and the left sidewalls of the first and second conductive regions have top surfaces that extend along the length of the base region.

6. The semiconductor device of claim 5 wherein only isolation material lies laterally between the right sidewalls of the first and second conductive regions and the left sidewalls of the first and second conductive regions.

7. The semiconductor device of claim 5 wherein the right sidewalls of the first and second conductive regions and the left sidewalls of the first and second conductive regions are substantially normal to a top surface of the conductive base region.

8. The semiconductor device of claim 1 and further comprising a third conductive region that touches the base section of the second conductive region.

9. The semiconductor device of claim 8 wherein the third conductive region, the right sidewalls of the first and second conductive regions, and the left sidewalls of the first and second conductive regions have top surfaces that lie in a same horizontal plane.

10. The semiconductor device of claim 1 and further comprising a non-conductive spacer touching a top surface of the base section of the first conductive region that extends horizontally from the left sidewall of the first conductive region to the second conductive region, and lying between the left sidewall of the first conductive region and the base section of the second conductive region such that a single horizontal plane that lies below a top surface of the base section of the second conductive region passes through the left sidewall of the first conductive region, the non-conductive spacer, and the base section of the second conductive region.

11. The semiconductor device of claim 10 wherein:
    the non-conductive spacer touches the left sidewall of the first conductive region and the left sidewall of the second conductive region; and
    the top surface of the base section of the first conductive region that extends horizontally from the left sidewall of the first conductive region to the second conductive region lies substantially in a first horizontal plane.

12. The semiconductor device of claim 11 wherein a top surface of the left sidewall and a top surface of the right sidewall of the first conductive region, and a top surface of the left sidewall and a top surface of the right sidewall of the second conductive region each lie substantially in a second horizontal plane.

13. The semiconductor device of claim 12 and further comprising a non-conductive structure touching the top surface of the base section of the second conductive region, the top surface of the base section of the second conductive region lying in a third horizontal plane, the third horizontal plane lying between the first and second horizontal planes, the non-conductive structure touching no portion of the base section of the second conductive region that lies below the top surface of the base section of the second conductive region, no portion of the non-conductive structure lying above the second horizontal plane.

14. The semiconductor device of claim 12 wherein a vertical distance measured from the top surface of the left sidewall of the second conductive region to the top surface of the base section of the first conductive region is greater than a vertical distance measured from the top surface of the left sidewall of the second conductive region to the top surface of the base section of the second conductive region.

15. A semiconductor device comprising:
an insulation structure;
an interconnect structure that touches the insulation structure, the interconnect structure having:
 a base structure being conductive and having a top surface;
 a first U-shaped structure being conductive and having a first horizontal portion and a first vertical portion that touches the first horizontal portion, the first horizontal portion having a bottom surface and a top surface, the bottom surface of the first horizontal portion touching the top surface of the base structure;
 a second U-shaped structure being conductive and having a second horizontal portion and a second vertical portion that touches the second horizontal portion, the second horizontal portion having a bottom surface and a top surface, the bottom surface of the second horizontal portion touching the top surface of the first horizontal portion; and
 a non-conductive spacer touching the first vertical portion, the second vertical portion, and the top surface of the first horizontal portion that extends horizontally from the first vertical portion to the second U-shaped structure, and lying between the first vertical portion and the second horizontal portion such that a single horizontal plane that lies below the top surface of the second horizontal portion passes through the first vertical portion, the non-conductive spacer, and the second horizontal portion.

16. The semiconductor device of claim 15 and further comprising a non-conductive structure that touches the second vertical portion and the top surface of the second horizontal portion, the non-conductive structure being horizontally spaced apart from the non-conductive spacer by the second vertical portion, the non-conductive structure touching no portion of the second horizontal portion that lies below the top surface of the second horizontal portion, no portion of the non-conductive structure lying above a top surface of the second vertical portion.

17. The semiconductor device of claim 15 wherein a vertical distance measured from a top surface of the second vertical portion to the top surface of the first horizontal portion is greater than a vertical distance measured from the top surface of the second vertical portion to the top surface of the second horizontal portion.

18. A semiconductor device comprising:
an insulation structure;
an interconnect structure that touches the insulation structure, the interconnect structure having:
 a base structure being conductive and having a top surface;
 a first U-shaped structure being conductive and having a first horizontal portion and a first vertical portion that touches the first horizontal portion, the first horizontal portion having a bottom surface and a top surface, the bottom surface of the first horizontal portion touching the top surface of the base structure, the first vertical portion having a top surface;
 a second U-shaped structure being conductive and having a second horizontal portion and a second vertical portion that touches the second horizontal portion, the second horizontal portion having a bottom surface and a top surface, the bottom surface of the second horizontal portion touching the top surface of the first horizontal portion, the second vertical portion having a top surface, the top surface of the first vertical portion and the top surface of the second vertical portion lying substantially in a first horizontal plane;
a non-conductive spacer touching the top surface of the first horizontal portion that extends horizontally from the first vertical portion to the second U-shaped structure, the top surface of the first horizontal portion that extends horizontally from the first vertical portion to the second U-shaped structure lying substantially in a second horizontal plane; and
a non-conductive structure touching the top surface of the second horizontal portion, the top surface of the second horizontal portion lying substantially in a third horizontal plane, the third horizontal plane lying between the first and second horizontal planes, the non-conductive structure touching no portion of the second horizontal portion that lies below the top surface of the second horizontal portion, no portion of the non-conductive structure lying above the top surface of the second vertical portion.

19. The semiconductor device of claim 18 wherein:
the non-conductive spacer touches the first vertical portion and the second vertical portion; and
the non-conductive structure is horizontally spaced apart from the non-conductive spacer by the second vertical portion.

20. The semiconductor device of claim 18 wherein a vertical distance measured from the top surface of the second vertical portion to the top surface of the first horizontal portion is greater than a vertical distance measured from the top surface of the second vertical portion to the top surface of the second horizontal portion.

* * * * *